(12) United States Patent
Kuttner

(10) Patent No.: US 8,908,804 B2
(45) Date of Patent: Dec. 9, 2014

(54) PHASE INTERPOLATOR

(71) Applicant: Intel Mobile Communications GmbH, Neubiberg (DE)

(72) Inventor: Franz Kuttner, Villach (AT)

(73) Assignee: Intel Mobile Communications GmbH, Neubiberg (DE)

( * ) Notice: Subject to any disclaimer, the term of this patent is extended or adjusted under 35 U.S.C. 154(b) by 51 days.

(21) Appl. No.: 13/873,622

(22) Filed: Apr. 30, 2013

(65) Prior Publication Data

US 2014/0321577 A1   Oct. 30, 2014

(51) Int. Cl.
*H03K 7/06* (2006.01)
*H04L 27/12* (2006.01)
*H04L 27/20* (2006.01)

(52) U.S. Cl.
CPC ................................. *H04L 27/20* (2013.01)
USPC .......................................... 375/302; 375/295

(58) Field of Classification Search
USPC .......................................................... 375/302
See application file for complete search history.

(56) References Cited

U.S. PATENT DOCUMENTS

| | | | |
|---|---|---|---|
| 2006/0038710 A1* | 2/2006 | Staszewski et al. | 341/143 |
| 2012/0242314 A1* | 9/2012 | Namekawa et al. | 323/283 |
| 2014/0072077 A1* | 3/2014 | Cheng et al. | 375/303 |

* cited by examiner

*Primary Examiner* — Erin File
(74) *Attorney, Agent, or Firm* — Eschweiler & Associates, LLC

(57) ABSTRACT

A phase interpolator is provided. The phase interpolator includes a plurality of capacitors, a first input for a clock signal, a second input for a phase shift clock signal and an output. The phase interpolator is configured to provide an interpolated, modulated phase information signal by switching, dependent on a modulation information, a first number of the capacitors between the first input and the output and a second number of the capacitors between the second input and the output.

22 Claims, 8 Drawing Sheets

PHASE INTERPOLATOR

BACKGROUND

Digital-to-time converters (DTC) are used to convert digital information to a time information or a phase shift. This time information or phase shift can be used for generating a frequency- or phase-modulated clock in a transmitter.

Digital-to-time converters have become attractive because in the last years it has become possible to implement or realize RFDACs (RFDAC=radio frequency digital-to-analog converters) which are able to directly transfer digital data to the RF (RF=radio frequency) domain. This RFDAC can be operated in IQ (I=in-phase; Q=quadrature) or polar mode.

In IQ mode a fixed clock can be used and the phase modulation is done by adding two orthogonal vectors. No extra frequency or phase modulator is needed, but a drawback of this method is a loss of square root of two of efficiency when the two vectors have to be summed together.

More power efficient is the polar mode where the amplitude modulation is done by an RFDAC and the phase information is delivered by modulating a PLL (PLL=phase locked loop). This polar mode works fine for low baseband signal bandwidth, but for modern wireless standards like LTE (LTE=long term evolution) bandwidth becomes 40 MHz and more. This bandwidth is too high for modulating a PLL.

SUMMARY

A phase interpolator is provided. The phase interpolator comprises a plurality of capacitors, a first input for a clock signal, a second input for a phase shift clock signal and an output. The phase interpolator is configured to provide an interpolated, modulated phase information signal by switching, dependent on a modulation information, a first number of the capacitors between the first input and the output and a second number of the capacitors between the second input and the output.

A digital to time converter (DTC) is provided. The digital-to-time converter comprises a clock signal provider, a phase interpolator and a low pass filter. The clock signal provider is configured to provide a clock signal and a phase shifted clock signal. The phase interpolator comprises a first input for the clock signal, a second input for the phase shifted clock signal and an output. The phase interpolator is configured to provide an interpolated, modulated phase information signal by switching, dependent on a modulation information, a first number of the capacitors between the first input and the output and a second number of the capacitors between the second input and the output. The low pass filter is configured to low-pass filter the interpolated, modulated phase information signal in order to obtain a modulated phase signal.

A mobile communication device is provided. The mobile communication device comprises an RF circuit configured to provide or receive RF signals and an antenna coupled to the RF circuit. The RF circuit comprises a phase interpolator comprising a first input for a clock signal, a second input for a phase shift clock signal, an output and a plurality of capacitors. The phase interpolator is configured to provide an interpolated, modulated phase information signal by switching, dependent on a modulation information, a first number of the capacitors between the first input and the output and a second number of the capacitors between the second input and the output.

DETAILED DESCRIPTION

Figure 1:
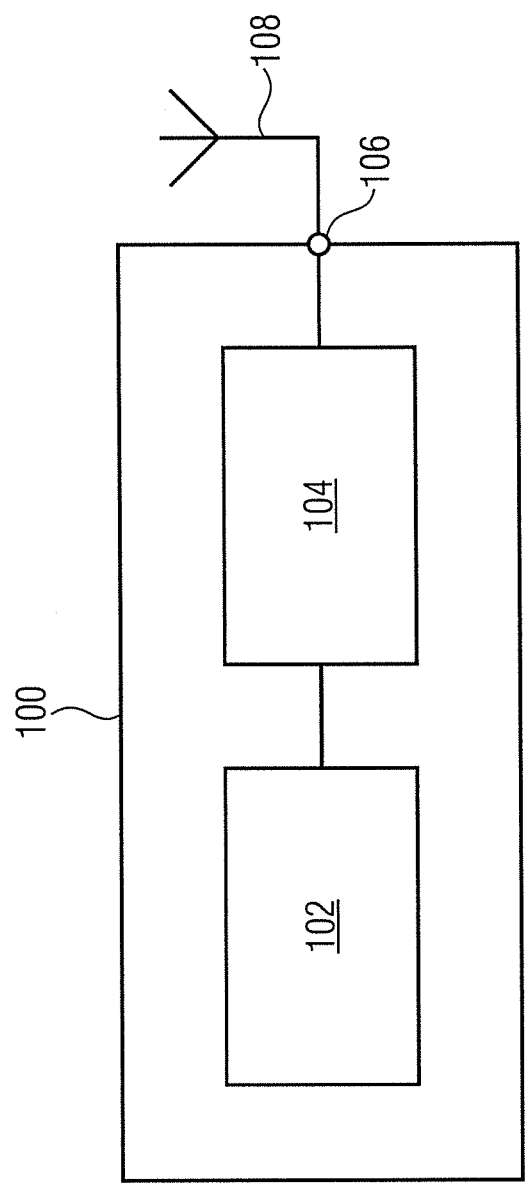
FIG. 1 shows a block diagram of an example mobile communication device.

In the following description, equal or equivalent elements or elements with equal or equivalent functionality are denoted in the following description by equal or equivalent reference numerals.

FIG. 1 shows a block diagram of an example mobile communication device 100 comprising a digital baseband processor 102, and an RF front end 104 coupled to the baseband processor 102 and to an antenna port 106. The antenna port 106 is provided to allow connection of an antenna 108 to the mobile communication device 100. The baseband processor 102 generates signals to be transmitted via the antenna 108 which are forwarded to the RF front end 104 generating a transmit signal output to the antenna port 106 for transmission via the antenna 108. The RF front end 104 may also receive signals via the antenna port 106 from the antenna 108 and provide respective signals to the baseband processor 102 for processing the received signals.

The phase modulator described in further detail below may be implemented in the RF frontend 104 of the mobile communication device. Furthermore, the phase interpolator described in further detail below may be used to implement or realize a digital-to-time converter (DTC) of the RF frontend 104 of the mobile communication device 100.

The mobile communication device 100 may be a portable mobile communication device and may be configured to perform a voice and/or data communication according to a mobile communication standard with other communication devices, like other mobile communication devices or base stations of a mobile communication network. Mobile communication devices may comprise a mobile handset, such as a mobile phone or a smart phone, a tablet PC, a broadband modem, a laptop, a notebook, a router, a switch, a repeater or a PC. Also, the mobile communication device 100 may be a base station of a communication network.

Figure 2:
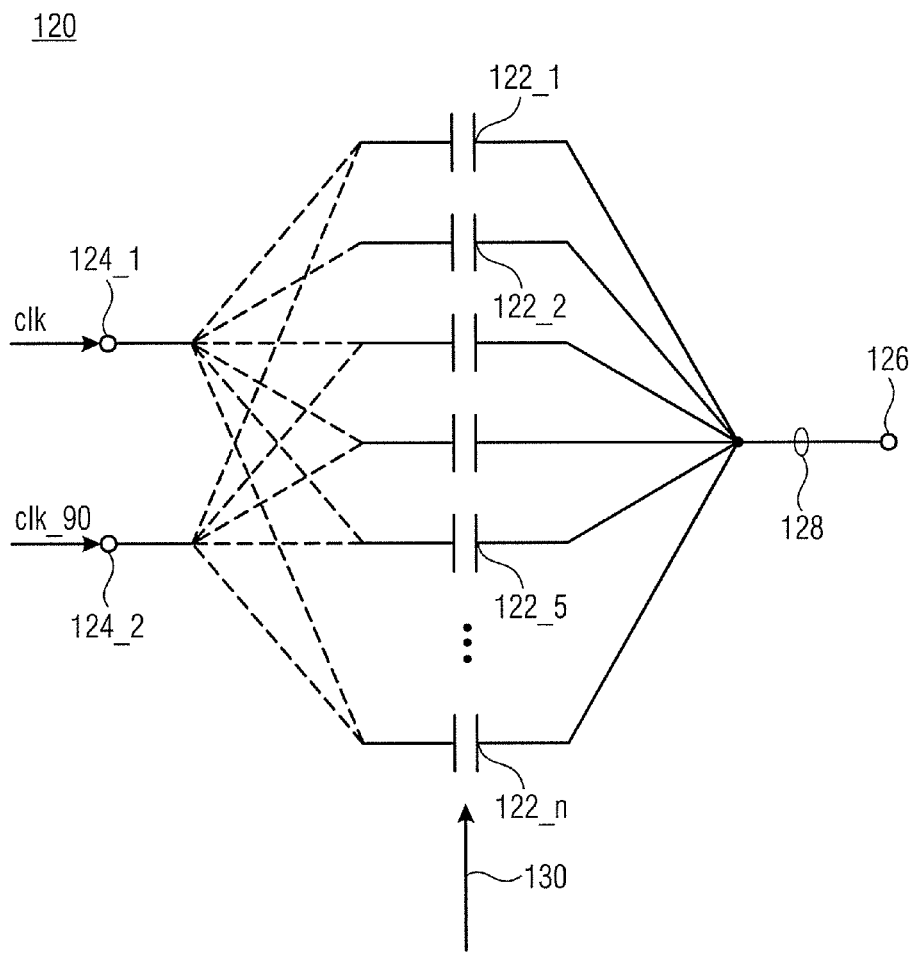
FIG. 2 shows a block diagram of a phase interpolator.

FIG. 2 shows a block diagram of a phase interpolator 120. The phase interpolator 120 comprises a plurality of capacitors 122_1 to 122_n, a first input 124_1 for a clock signal clk, a second input 124_2 for a phase-shifted clock signal clk_90 and an output 126. The phase interpolator 120 is configured to provide an interpolated, modulated phase information signal 128 by switching, dependent on a modulation information 130, a first number of the capacitors 122_1 to 122_i between the first input 124_1 and the output 126 and a second number of the capacitors 122_i+1 to 122_n between the second input 124_2 and the output 126.

Note that the phase interpolator 120 can comprise up to n capacitors 122_1 to 122_n, wherein n is a natural number greater than or equal to 2 (n≥2). For example, the phase interpolator 120 can comprise 2, 4, 8, 16, 32, 64, 128, 256, 512, 1024, 2048, 4096, 8192 or even more capacitors 122_1 to 122_n.

The first number of capacitors 122_1 to 122_i and the second number of capacitors 122_i+1 to 122_n can form the plurality of capacitors 122_1 to 222_n. In other words, the phase interpolator 120 can be configured to connect, dependent on the modulation information, i capacitors 122_1 to 122_i of the plurality of capacitors 122_1 to 122_n to the first input 124_1, and to connect n-i capacitors 122_i+1 to 122_n of the plurality of capacitors 122_1 to 122_n to the second input 124_2, wherein i is a natural number greater than or equal to zero and smaller than or equal to n ($0 \leq i \leq n$). In other words, the phase interpolator 120 can be configured to connect, dependent on the modulation information 130, each capacitor of the plurality of capacitors 122_1 to 122_n either to the first input 124_1 or to the second input 124_2. In other words, the phase interpolator can be configured to switch each capacitor of the plurality of capacitors 122_1 to 122_n either between the first input 124_1 and the output 126 or between the second input 124_2 and the output 126.

Naturally, the phase interpolator 120 may also be configured to connect, dependent on the modulation information, only a certain number of the plurality of capacitors 122_1 to 122_n between the first input 124_1 and the output and between the second input 124_2 and the output, respectively. Thus, dependent on the modulation information, some capacitors of the plurality of capacitors 122_1 to 122_n might be connected neither to the first input 124_1 nor to the second input 124_2.

The plurality of capacitors 122_1 to 122_n may comprise the same capacitance value in one embodiment. Naturally, it is also possible that the plurality of capacitors 122_1 to 122_n comprise different capacitance values in one embodiment. In that case, the phase interpolator 120 may be configured to connect the capacitors of the plurality of capacitors 122_1 to 122_n to the respective input 124_1 and 124_2 which approximate a capacitance value corresponding to the current modulation information 130.

The phase shifted clock signal clk_90 can be a phase-shifted version of the clock signal clk, e.g., a by 5°, 10°, 20°, 30°, 40°, 50° 60°, 70°, 80°, 90°, 100°, 110°, 120°, 130°, 140°, 150°, 160°, 170°, 180° phase-shifted version of the clock signal clk.

Figure 3:
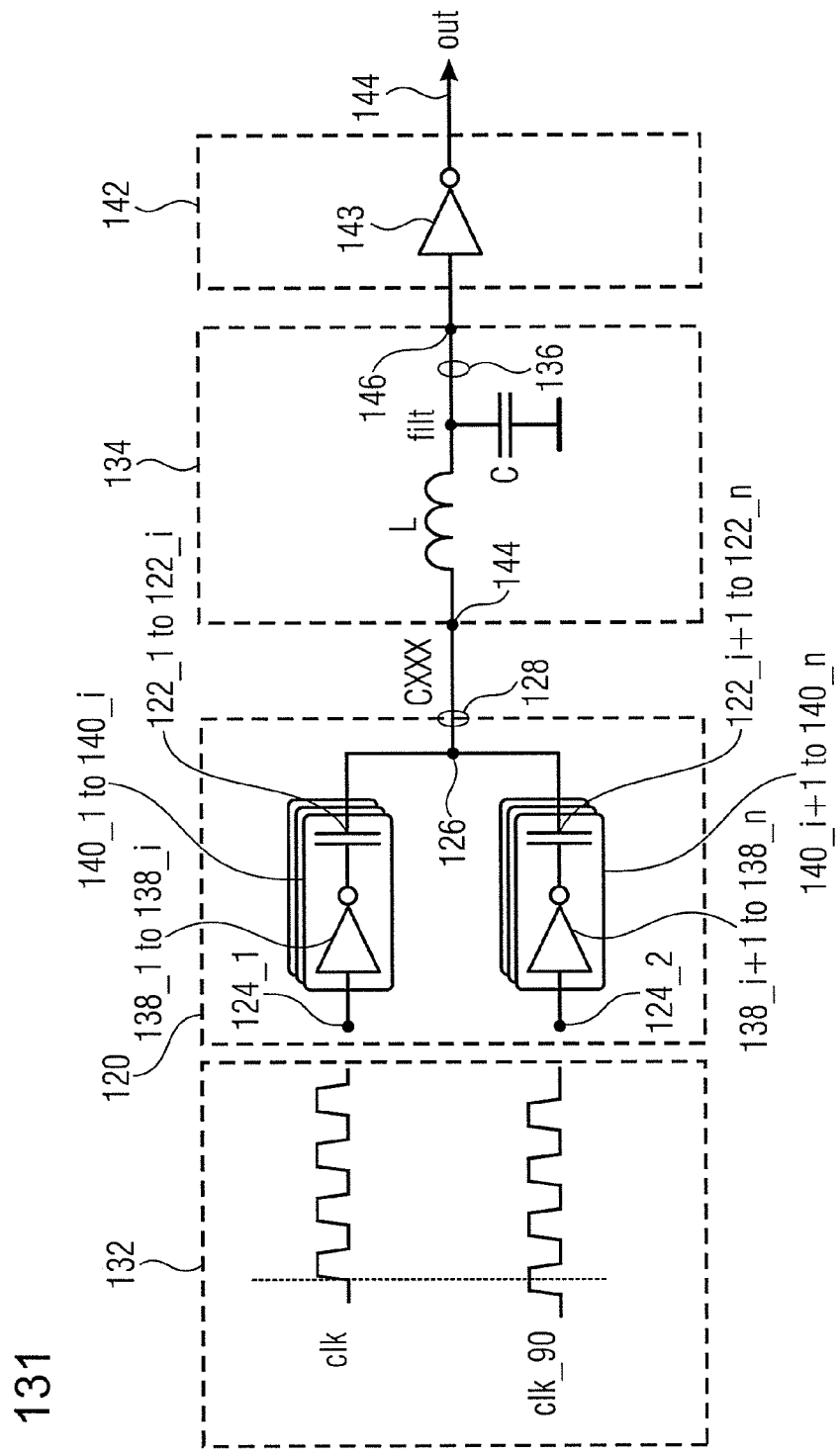
FIG. 3 shows a block diagram of a digital-to-time converter.

FIG. 3 shows a block diagram of a digital-to-time converter (DTC) 131. The digital-to-time converter 131 comprises a clock signal provider 132, a low-pass filter 134 and the phase interpolator 120 described above. The clock signal provider 132 can be configured to provide the clock signal clk and the phase shift clock signal clk_90. The low-pass filter 134 can be configured to low-pass filter the interpolated, modulated phase information signal 128 in order to obtain a modulated phase signal 136.

The low-pass filter 134 can comprise an input 144 configured to receive the interpolated, modulated phase information signal 128 from the output 126 (node CXXX) of the phase interpolator 120, and an output 146 configured to provide the modulated phase signal 136. Therefore, the input 144 of the low-pass filter 134 can be connected to the output 126 of the phase interpolator 120.

The low-pass filter 134 can comprise an inductor L and a capacitor C, wherein the inductor L can be connected in series between the input 144 and the output 146 of the low-pass filter 134, and wherein the capacitor C can be connected in series between the output 146 of the low-pass filter 134 and a reference terminal configured to provide a reference potential, e.g., a ground terminal configured to provide ground potential.

As indicated in FIG. 3, the phase interpolator 120 can comprise a plurality of inverters 138_1 to 138_n. Thereby, the phase interpolator 120 can be configured to connect the first number of the capacitors 122_1 to 122_i to the first input 124_1 via a first number of the inverters 138_1 to 138_i and to connect the second number of capacitors 122_i+1 to 122_n to the second input 124_2 via a second number of the inverters 138_i+1 to 138_n.

In other words, the phase interpolator 120 can comprise a plurality of capacitor cells 140_1 to 140_n, wherein each capacitor cell of the plurality of capacitor cells 140_1 to 140_n comprises one inverter of the plurality of inverters 138_1 to 138_n and one capacitor of the plurality of capacitors 122_1 to 122_n connected in series. Thereby, the phase interpolator 120 can be configured to connect, dependent on the modulation information 130 each capacitor cell of the plurality of capacitor cells 140_1 to 140_n either between the first input 124_1 and the output 126 or between the second input 124_2 and the output 126. In other words, the phase interpolator 120 can be configured to switch, dependent on the modulation information 130, a first number of the capacitor cells 140_1 to 140_i between the first input 124_1 and the output 126 and a second number of the capacitor cells 140_i+1 to 140_n between the second input 124_2 and the output 126.

The digital-to-time converter 131 can comprise an analog-to-digital converter 142 configured to convert the modulated phase signal 136, e.g. present at the node filt, into a modulated clock signal 144. Therefore, the digital-to-time converter 131 can be connected to the output 146 of the low-pass filter 134. Moreover, the analog-to-digital converter 142 can comprise at least one inverter 143 or comparator.

For example, in the proposed solution a clock signal clk and a by 90° shifted clock signal clk_90 can be used as inputs for the phase interpolator 120. Zero and 90 degree phase shifted signals can be generated by a divider from higher clock-frequency (see FIG. 5). These two-phase-shifted clock signals clk and clk_90 can be interpolated by the capacitor network of the phase interpolator 120.

Thereby, the information for the phase is located in the amplitude of the signal present at the node CXXX 126. This information can be reconstructed by filtering the fundamental frequency by a passive LC filter 134.

Figure 4:
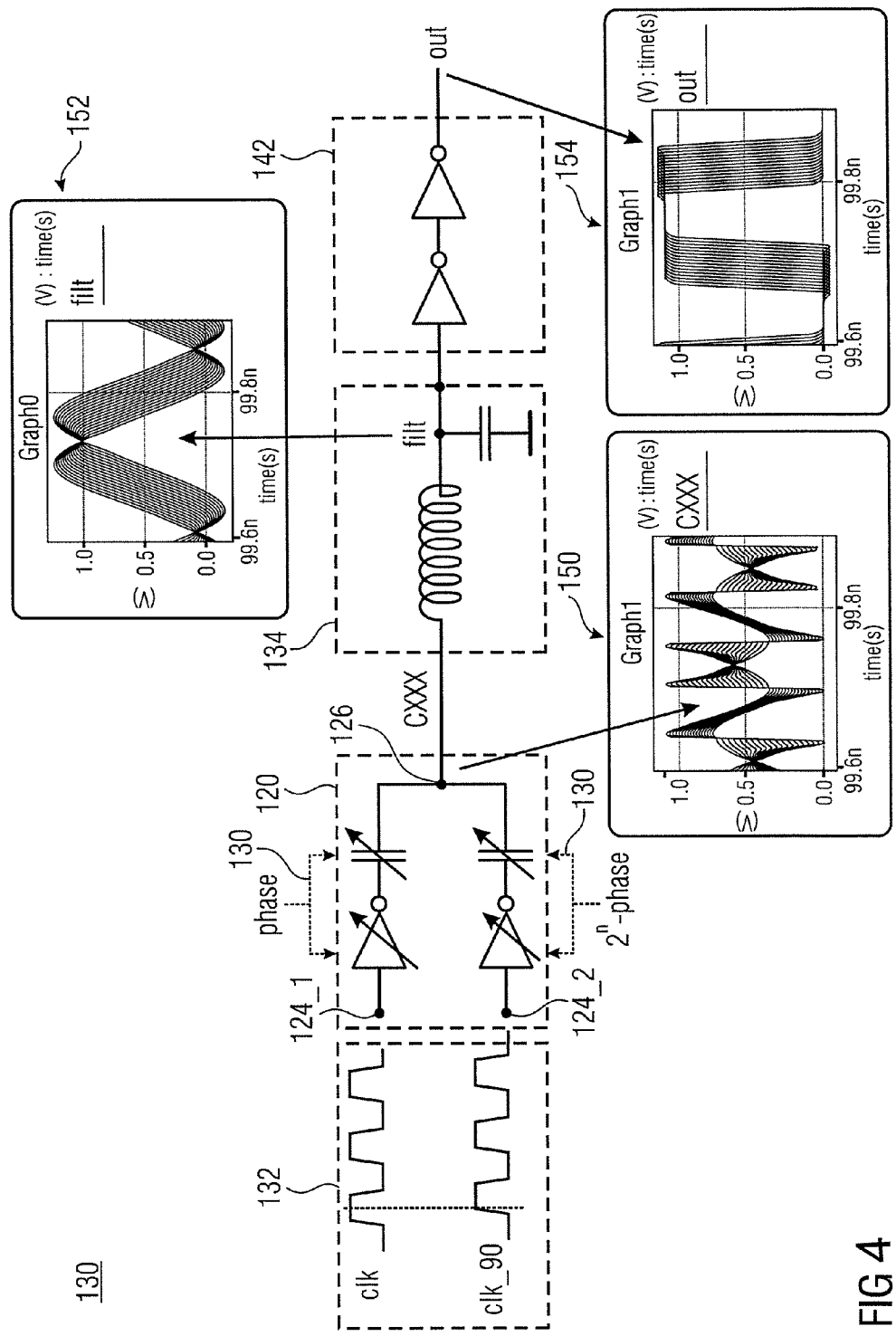
FIG. 4 shows a block diagram of the digital-to-time converter and diagrams of signals present at different nodes of the digital-to-time converter.

FIG. 4 shows a block diagram of the digital-to-time converter and diagrams of signals present at different nodes of the digital-to-time converter 131.

A first diagram 150 shows a waveform of the interpolated, modulated phase information signal 128 provided by the phase interpolator 120 at the output 126 of the phase interpolator 120. Thereby, the ordinate denotes the amplitude in volts, where the abscissa denotes the time in seconds.

A second diagram 152 shows a waveform of the modulated phase signal 136 provided by the low-pass filter 134 at its output 146 (node filt). Thereby, the ordinate denotes the amplitude in volts, where the abscissa denotes the time in seconds.

A third diagram 154 shows a waveform of the modulated clock signal 144 provided by the analog-to-digital converter 142. Thereby, the ordinate denotes the amplitude in volts, where the abscissa denotes the time in seconds.

In other words, FIG. 4 shows the waveforms of the signals of the digital-to-time converter 131 comprising the phase interpolator 120.

The digital-to-time converter 131 comprising the phase interpolator 120 has the advantage of an improved noise performance, because the inductor L and the capacitor C of the low-pass filter 134 do not contribute to the phase noise. The main contributor for the phase noise is the analog-to-digital converter 142 connected to the output of the low-pass filter 134. This analog-to-digital converter 142 (e.g., realized or implemented by means of at least one inverter 143 (as shown in FIG. 4) or at least one comparator) can be configured to regenerate a CMOS (CMOS=complementary metal oxide semiconductor) square wave clock from a sinusoidal signal at the node filt. The limited slew rate of the sinusoidal signal at the switching level of the converter 142 is the reason for thermal and flicker noise. The start and end point, e.g., 0° and 90°, are given by design. Note that interpolation can also be done for other coarse phase shifts, e.g. 0° and 60°, in that case start and end point are 0° and 60°.

The generated signal can be filtered by the LC low-pass filter 134, so that sigma delta modulation can be used to increase the digital resolution. Far off noise, which is critical for transmitter application, can be suppressed by the LC filter.

Figure 5:
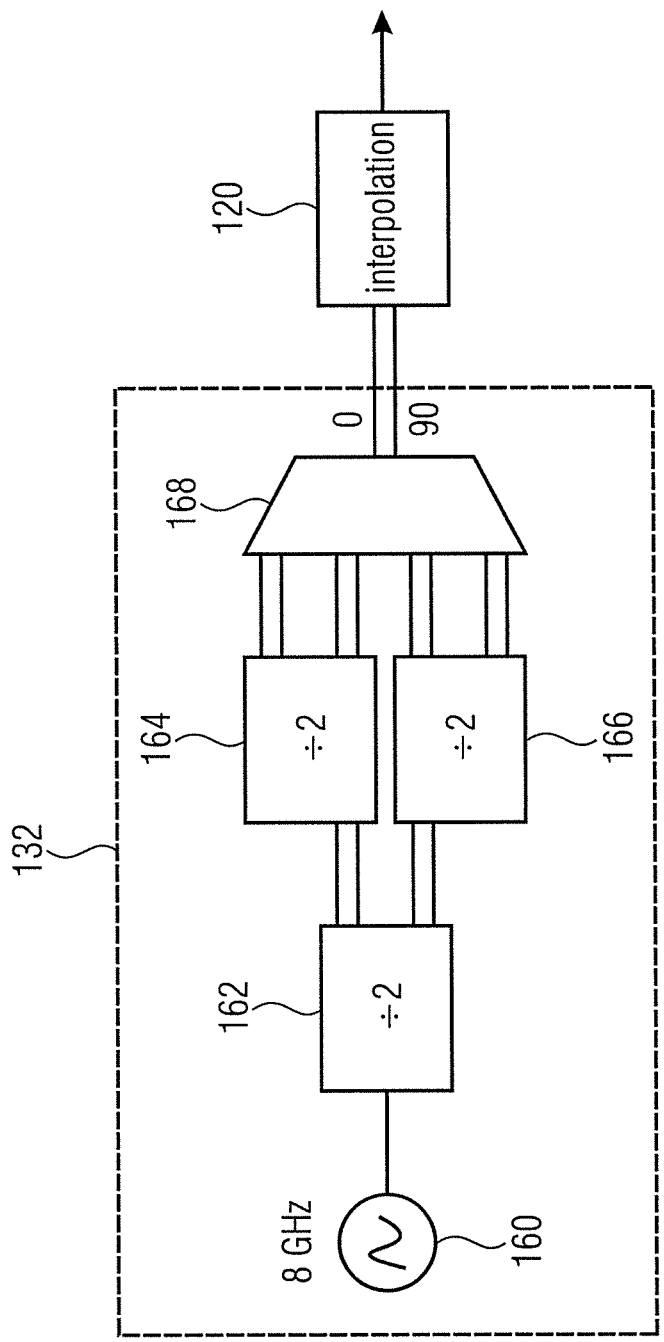
FIG. 5 shows a block diagram of the clock signal provider and of the phase interpolator.

FIG. 5 shows a block diagram of the clock signal provider 132 and of the phase interpolator 120. As shown in FIG. 5, the clock signal provider 132 can be configured to provide the clock signal clk and the phase shift clock signal clk_90 based on a clock signal having a higher clock frequency than the clock signal clk and the phase shift clock signal clk_90.

The clock signal provider 132 can comprise a local oscillator 160 configured to provide a clock signal having a clock frequency higher than the clock frequency of the clock signal clk and the phase-shifted clock signal clk_90.

Furthermore, the clock signal provider 132 can comprise a first divider 162, a second divider 164, a third divider 166 and a multiplexer 168. The first divider 162 can comprise a first input connected to the local oscillator and four outputs. The second divider 164 can comprise two inputs connected to two of the four outputs of the first divider 164, and four outputs. The third divider 166 can comprise two inputs connected to the other two of the four outputs of the first divider 164, and four outputs. The multiplexer can comprise eight inputs and two outputs for providing the clock signal clk and the phase shifted clock signal clk_90, wherein four of the eight inputs are connected to the four outputs of the second divider 164, and wherein the other four of the eight inputs are connected to the four outputs of the second divider 164.

For example, the local oscillator 160 can be configured to provide a clock signal having a clock frequency of 8 GHz, where the clock signal provider 132 can be configured to provide a clock signal clk and a phase-shifted clock signal clk_90 each having a clock frequency of 2 GHz by means of the first divider 162, the second divider 164, the third divider 166 and the multiplexer 168.

Figure 6:
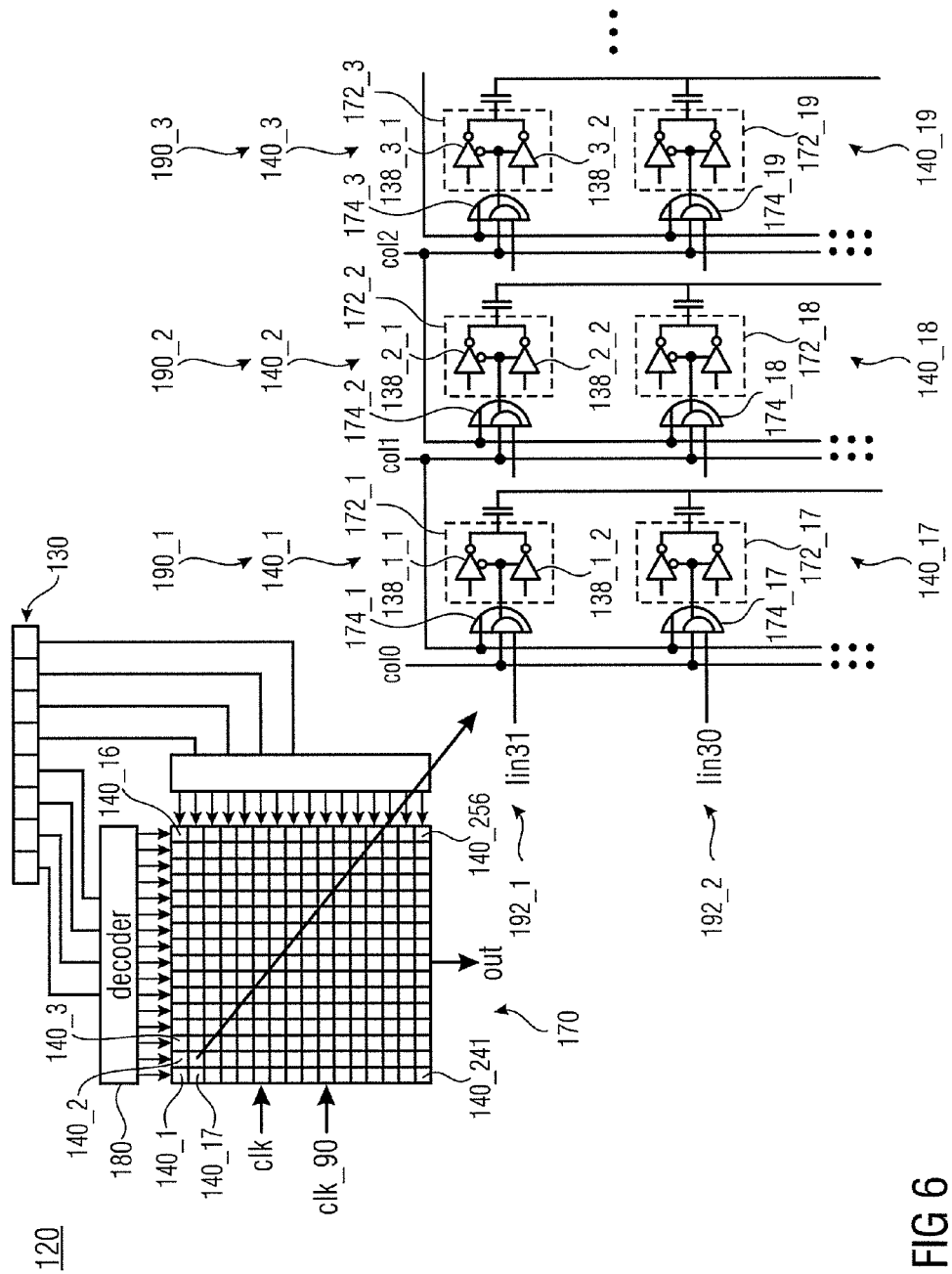
FIG. 6 shows a block diagram of a phase interpolator comprising an array of capacitor cells.

FIG. 6 shows a block diagram of a phase interpolator 120 comprising an array of capacitor cells 140_1 to 140_n (n=256). Each capacitor cell comprises a capacitor of the plurality of capacitors 122_1 to 122_n (n=256) and a multiplexer 172_1 to 172_n (n=256) configured to connect the capacitor 122_1 to 122_n (n=256) of the respective capacitor cell 140_1 to 140_n (n=256), dependent on the modulation information, either to the first input 124_1 of the phase interpolator 120 or the second input 124_2 of the phase interpolator 120.

For example, the first capacitor cell 140_1 of the plurality of capacitor cells 122_1 to 122_n (n=256) can comprise a first multiplexer 172_1 and a first capacitor 122_1 connected in series between the first multiplexer 172_1 and the output 126 of the phase interpolator 120. The first multiplexer 172_1 can be configured to connect, dependent on the modulation information, the first capacitor 122_1, either to the first input 124_1 of the phase interpolator 120 or to the second input 124_2 of the phase interpolator 120.

Similarly, the second capacitor cell 140_2 of the plurality of capacitor cells 122_1 to 122_n (n=256) can comprise a second multiplexer 172_2 and a second capacitor 122_2 connected in series between the second multiplexer 172_2 and the output 126 of the phase interpolator 120. The second multiplexer 172_2 can be configured to connect, dependent on the modulation information, the second capacitor 122_2, either to the first input 124_1 of the phase interpolator 120 or to the second input 124_2 of the phase interpolator 120.

Each multiplexer 172_1 to 172_n can comprise two inverters in one embodiment, wherein a first inverter of the two inverters can be connected to the first input 124_1 of the phase interpolator 120, wherein a second inverter of the two inverters can be connected to the second input 124_1 of the phase interpolator 120. Thereby, each multiplexer 172_1 to 172_n can be configured to activate one of the two inverters and to deactivate the other dependent on the modulation information.

For example, the first multiplexer 172_1 of the first capacitor cell 140_1 can comprise a first inverter 138_1_1 and a second inverter 138_1_2. The first inverter 138_1_1 can be connected in series between the first input 124_1 of the phase interpolator 120 and the first capacitor 122_1, wherein the second inverter 138_1_2 can be connected in series between the second input 124_2 of the phase interpolator 120 and the first capacitor 122_1. Thereby, the first multiplexer 172_1 can be configured to connect the first capacitor 122_1 either to the first input 124_1 of the phase interpolator 120 via the first inverter 138_1_1 or to the second input 124_2 of the phase interpolator 120 via the second inverter 138_1_2.

Naturally, it is also possible that each capacitor cell of the plurality of capacitor cells 140_1 to 140_n comprises two capacitors, wherein one of the two capacitors can be connected in series between the first inverter of the multiplexer of the respective capacitor cell and the output 126 of the phase interpolator 120, and wherein the other of the two capacitors can be connected in series between the second inverter of the multiplexer of the respective capacitor cell and the output 126 of the phase interpolator 120.

Note that in the embodiment of FIG. 6, the phase interpolator 120 comprises an array of 256 capacitor cells 140_1 to 140_n (n=256). Naturally, the phase interpolator may also comprise an array of 2, 4, 8, 16, 32, 64, 128, 256, 512, 1024, 2048, 4096, 8192 or even more capacitor cells 140_1 to 140_n.

As shown in FIG. 6, the array of capacitor cells 140_1 to 140_n can be arranged in a plurality of lines and columns, wherein the phase interpolator 120 can be configured to transform the modulation information 130 in a plurality of line control signals and a plurality of column control signals using a thermometer code, and to control the multiplexers 172_1 to 172_n of the capacitor cells 140_1 to 140_2 with the line control signals and the column control signals.

For example, referring to FIG. 6, the capacitor cells 140_1 to 140_n can be arranged in 16 lines and 16 columns, wherein the phase interpolator 120 can be configured to transform the modulation information 130 in 16 column control signals col_0 to col_15 and 16 line control signals lin_0 to lin_15.

Furthermore, each capacitor cell 140_1 to 140_n of the plurality of capacitor cells 140_1 to 140_n can comprise a logic gate 174_1 to 174_n configured to provide a control signal for the multiplexer 172_1 to 172_n of the respective capacitor cell 140_1 to 140_n dependent from a column control signal of the plurality column control signals col_0 to col_15 and a line control signal of the plurality of line control signals lin_0 to lin_15 corresponding to the respective capacitor cell 140_1 to 140_n.

For example, the first capacitor cell 140_1 of the plurality of capacitor cells 140_1 to 140_n can comprise a first logic gate 174_1 configured to receive a first column control signal col_0 of the plurality of column control signals col_0 to col_15 and a first line control signal lin_0 of the plurality of line control signals lin_0 to lin_15, and to provide a control signal for the first multiplexer 172_1 dependent on the first column control signal col_0 and the first line control signal lin_0.

The logic gates 174_1 to 174_n can be configured to perform a logic AND operation of the column control signal of the plurality column control signals col_0 to col_15 and the line control signal of the plurality of line control signals lin_0 to lin_15 corresponding to the respective capacitor cell 140_1 to 140_n, wherein the control signal for the multiplexer 172_1 to 172_n of the respective capacitor cell 140_1 to 140_n is based on the result of the AND operation.

Moreover, the logic gates 174_1 to 174_n of the capacitor cells of a column having a lower order can be further configured to receive a column control signal corresponding to a column having a higher order (or index), and to override the respective column control signal and the respective line control signal dependent on the column control signal corresponding to the column having the higher order (or index).

The logic gates 174_1 to 174_n can be configured to perform a logic OR operation of the column control signal corresponding to the column having the higher order and of the result of the AND operation, in order to obtain the control signal for the multiplexer 172_1 to 172_n of the respective capacitor cell 140_1 to 140_n.

For that purpose, each logic gate 174_1 to 174_n can comprise an AND gate and an OR gate, wherein the AND gate can be configured to receive the column control signal of the plurality column control signals col_0 to col_15 and the line control signal of the plurality of line control signals lin_0 to lin_15 corresponding to the respective capacitor cell 140_1 to 140_n. The OR gate can be configured to receive the column control signal corresponding to the column having the higher order and the signal provided by the AND gate in order to obtain the control signal for the multiplexer.

For example, the first logic gate can comprise an AND gate and an OR gate, wherein the AND gate is configured to receive the first column control signal col_0 and the first line control signal lin_0. The OR gate can be configured to receive the second column control signal col_1 and the signal provided by the AND gate in order to obtain the control signal for the first multiplexer 172_1.

Similarly, the second logic gate 174_2 can comprise an AND gate and an OR gate, wherein the AND gate is configured to receive the second column control signal col_1 and the first line control signal lin_0. The OR gate can be configured to receive the third column control signal col_2 and the signal provided by the AND gate in order to obtain the control signal for the second multiplexer 172_2.

As shown in FIG. 6, the phase interpolator 120 can comprise a column decoder 190 configured to provide the plurality of column control signals based on the modulation information 130 (e.g., a 8 or more bit modulation information), and a line decoder 192 configured to provide the plurality of line control signals based on the modulation information.

In other words, the phase interpolator 120 can be a capacitor array with multiplexers. It can be arranged as shown in FIG. 6. With this arrangement a digital resolution for a thermometer coded array of up to 12 bits (4096 steps) or even more is possible.

In other words, the digital-to-time converter can be configured to perform a phase interpolation by a capacitor network and switching part of the capacitors to a clock signal clk and another part to a phase shifted clock signal clk_90. The relation between the two parts determines the resulting phase shift. Moreover, the digital-to-time converter can be configured to filter the information for the phase by a passive LC filter. Furthermore, the digital-to-time converter can be configured to reconstruct the clock after the filter by inverters or a comparator.

The digital-to-time converter 131 can comprise a capacitor with multiplexer arranged in an array. Further, the digital-to-time converter 131 can be configured to compensate the intrinsic nonlinearity by digital pre-distortion or by nonlinear sizing of the capacitors.

Figure 7A:
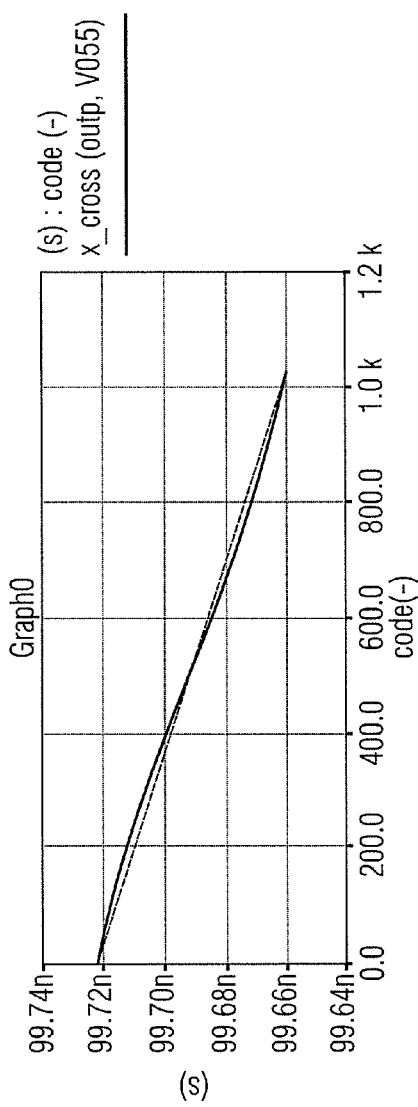
FIG. 7a shows in a diagram simulation results of a time shift of the digital-to-time converter.

FIG. 7a shows in a diagram simulation results of a time shift of the digital to time converter. Thereby, the ordinate denotes the time when the output of the phase interpolator crosses 50% of full swing in ns=$10^{-9}$ seconds, where the abscissa denotes the modulation information (10 bits or 1024 steps).

Figure 7B:
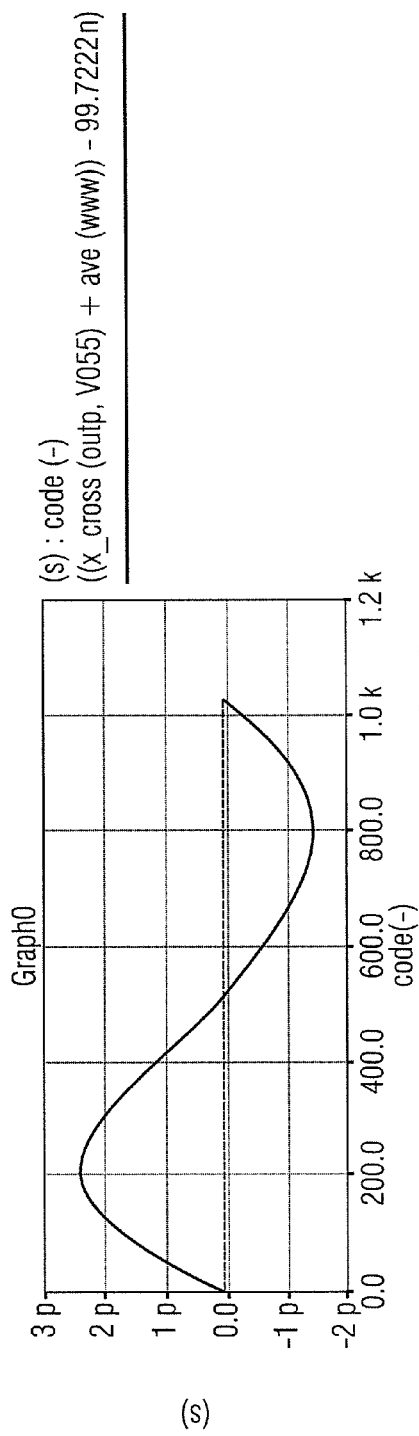
FIG. 7b shows in a diagram an intrinsic nonlinearity of the digital-to-time converter.

FIG. 7b shows in a diagram an intrinsic nonlinearity of the digital to time converter. Thereby, the ordinate denotes the error of the 50% crossing time compared to the ideal time in ps (picoseconds=$10^{-12}$ seconds), where the abscissa denotes the modulation information (10 bits or 1024 steps).

In other words, FIG. 7a shows the measured time at which the output signal (154 in FIG. 4) reaches half of the height, in dependence on the modulation information. Thereby, a straight line would be ideal. FIG. 7b shows the error, i.e. the deviation (or difference) from the straight line.

As indicated in FIG. 7b, simulation shows that this structure has an intrinsic nonlinearity. The nonlinearity is given by the system and constant, therefore it can be compensated by digital pre-distortion or by nonlinear sizing of the capacitors.

Figure 8:
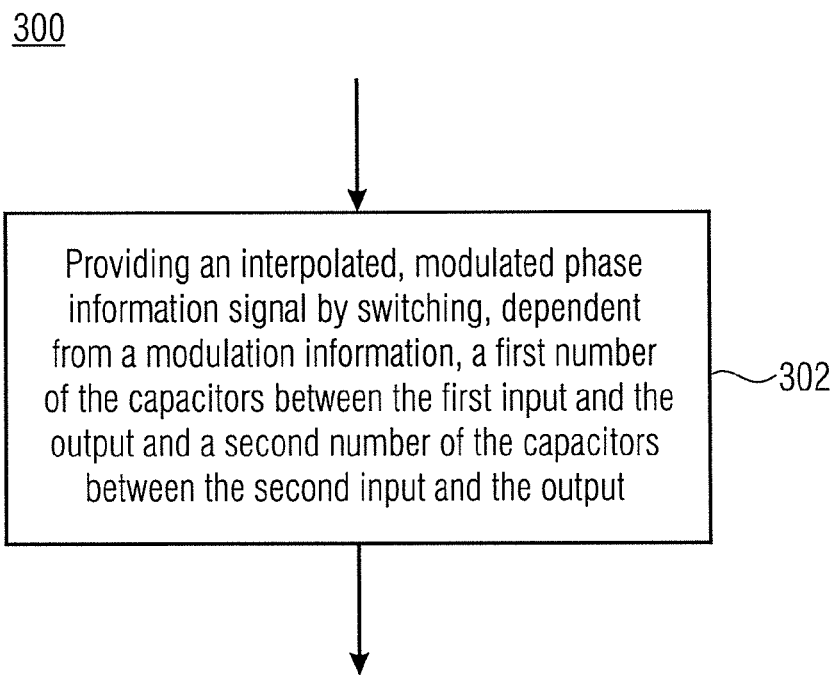
FIG. 8 is a flow chart diagram of a method for operating a phase interpolator.

FIG. 8 shows a flowchart of a method 300 for operating a phase interpolator 120. The phase interpolator comprises a first input 124_1 for a clock signal clk, a second input 124_2 for a phase shifted clock signal clk_90, an output 126 and a plurality of capacitors 122_1 to 122_n. The method comprises providing an interpolated, modulated phase information signal by switching, dependent from a modulation information, a first number of the capacitors 122_1 to 122_i between the first input 124_1 and the output 126 and a second number of the capacitors 122_i+1 to 122_n between the second input 124_2 and the output 126 at 302.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like a microprocessor, a programmable computer or an electronic circuit. Some one or more of the most important method steps may be executed by such an apparatus.

The implementation may be in hardware or in software or may be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code on a non-transitory medium, the program code being operative for performing the method when the computer program product runs on a computer. The program code may be stored on a machine readable carrier.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A phase interpolator, comprising:
a plurality of capacitors;
a first input configured to receive a clock signal;
a second input configured to receive a phase shifted clock signal; and
an output,
wherein the phase interpolator is configured to provide an interpolated, modulated phase information signal by switching, dependent on a modulation information, a first number of the capacitors between the first input and the output and a second number of the capacitors between the second input and the output.

2. The phase interpolator according to claim 1, wherein the phase interpolator further comprises a plurality of inverters, wherein the phase interpolator is configured to connect the first number of the capacitors to the first input via a first number of the inverters and to connect the second number of capacitors to the second input via a second number of the inverters.

3. The phase interpolator according to claim 1, wherein the first number of the capacitors and the second number of the capacitors form the plurality of capacitors.

4. The phase interpolator according to claim 1, wherein each of the plurality of capacitors comprise the same capacitance value.

5. The phase interpolator according to claim 1, wherein the phase shifted clock signal is a phase shifted version of the clock signal.

6. The phase interpolator according to claim 1, wherein the phase interpolator further comprises a plurality of multiplexers configured to connect, dependent on the modulation information, the first number of capacitors to the first input and the second number of the capacitors to the second input.

7. The phase interpolator according to claim 6, wherein each multiplexer comprises two inverters, wherein a first inverter of the two inverters is connected to the first input, and a second inverter of the two inverters is connected to the second input and, wherein each multiplexer is configured to activate one of the two inverters and to deactivate the other dependent on the modulation information.

8. The phase interpolator according to claim 7, wherein the first inverter is connected in series between the first input and a capacitor of the plurality of capacitors, and wherein the second inverter is connected in series between the second input and the respective capacitor.

9. The phase interpolator according to claim 7, wherein the first inverter is connected in series between the first input and a capacitor of the plurality of capacitors, and wherein the second inverter is connected in series between a further capacitor of the plurality of capacitors.

10. The phase interpolator according to claim 1, wherein the phase interpolator comprises an array of capacitor cells, wherein each capacitor cell comprises a capacitor of the plurality of capacitors and a multiplexer configured to connect the capacitor of the respective capacitor cell, dependent on the modulation information, either to the first input of the phase interpolator or to the second input of the phase interpolator.

11. The phase interpolator according to claim 10, wherein the array of capacitor cells is arranged in a plurality of lines and columns, wherein the phase interpolator is configured to transform the modulation information into a plurality of line control signals and a plurality of column control signals using a thermometer code, and control the multiplexers of the capacitor cells with the line control signals and the column control signals.

12. The phase interpolator according to claim 11, wherein each capacitor cell comprises a logic gate configured to provide a control signal for the multiplexer of the respective capacitor cell dependent on a column control signal of the plurality column control signals and a line control signal of the plurality of line control signals corresponding to the respective capacitor cell.

13. The phase interpolator according to claim 10, wherein the phase interpolator further comprises:
a column decoder configured to provide a plurality of column control signals based on the modulation information; and
a line decoder configured to provide a plurality of line control signals based on the modulation information,
wherein the array of capacitor cells is arranged in a plurality of lines and columns, wherein each capacitor cell comprises a logic gate configured to receive a column control signal of the plurality of column control signals and a line control signal of the plurality of line control signals corresponding to the respective capacitor cell, and provide a control signal for controlling the multiplexer of the respective capacitor cell based on the respective column control signal and the respective line control signal.

14. The phase interpolator according to claim 13, wherein logic gates of capacitor cells of a column having a lower order are further configured to receive a column signal corresponding to a column having a higher order, and override the respective column control signal and the respective line control signal dependent from the column control signal corresponding to the column having the higher order.

15. A digital to time converter, comprising:
a clock signal provider configured to provide a clock signal and a phase shifted clock signal;
a phase interpolator comprising a first input configured to receive the clock signal, a second input configured to receive the phase shifted clock signal and an output, wherein the phase interpolator is configured to provide an interpolated, modulated phase information signal by switching a first number of capacitors between the first input and the output and a second number of capacitors between the second input and the output dependent on a modulation information; and
a low pass filter configured to low pass filter the interpolated, modulated phase information signal in order to obtain a modulated phase signal.

16. The digital to time converter according to claim 15, further comprising an analog to digital converter configured to convert the modulated phase signal into a modulated clock signal.

17. The digital to time converter according to claim 16, wherein the digital to time converter is implemented by an inverter or a comparator.

18. The digital to time converter according to claim 15, wherein the low pass filter comprises an inductor and a capacitor.

19. The digital to time converter according to claim 15, wherein the clock signal provider is configured to provide the clock signal and the phase shifted clock signal based on an initial clock signal having a higher clock frequency than the clock signal and the phase shifted clock signal.

20. A mobile communication device, comprising:
   an RF circuit configured to provide or receive RF signals; and
   an antenna port coupled to the RF circuit;
   wherein the RF circuit comprises a phase interpolator comprising a first input configured to receive a clock signal, a second input configured to receive a phase shifted clock signal, an output, and a plurality of capacitors, wherein the phase interpolator is configured to provide an interpolated, modulated phase information signal by switching, dependent on a modulation information, a first number of the capacitors between the first input and the output and a second number of the capacitors between the second input and the output.

21. A method for operating a phase interpolator comprising a first input configured to receive a clock signal, a second input configured to receive a phase shifted clock signal, an output, and a plurality of capacitors, the method comprising:
   providing an interpolated, modulated phase information signal by switching, dependent on a modulation information, a first number of the capacitors between the first input and the output and a second number of the capacitors between the second input and the output.

22. A non-transitory storage medium having stored thereon a computer program having a program code for performing, when running on a computer or microprocessor, a method for operating a phase interpolator comprising a first input configured to receive a clock signal, a second input configured to receive a phase shifted clock signal, an output, and a plurality of capacitors, the method comprising:
   providing an interpolated, modulated phase information signal by switching, dependent on a modulation information, a first number of the capacitors between the first input and the output and a second number of the capacitors between the second input and the output.

* * * * *